(12) United States Patent
Pasqualini

(10) Patent No.: US 6,380,770 B1
(45) Date of Patent: Apr. 30, 2002

(54) LOW GROUND BOUNCE AND LOW POWER SUPPLY BOUNCE OUTPUT DRIVER WITH DUAL, INTERLOCKED, ASYMMETRIC DELAY LINES

(75) Inventor: Ronald Pasqualini, Los Altos, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 09/615,375

(22) Filed: Jul. 13, 2000

Related U.S. Application Data

(63) Continuation-in-part of application No. 09/168,547, filed on Oct. 8, 1998.

(51) Int. Cl.[7] ............................ H03B 1/00; H03K 3/00
(52) U.S. Cl. ................... 327/112; 327/401; 327/384; 326/27; 326/87
(58) Field of Search ........................ 327/108–112, 170, 327/379, 382, 384, 385, 392–396, 401, 261, 262, 276, 284; 326/26, 27, 82, 83, 85–87; 361/91, 14

(56) References Cited

U.S. PATENT DOCUMENTS

| | | | | |
|---|---|---|---|---|
| 4,719,369 A | * | 1/1988 | Asano et al. ................. 326/87 |
| 5,122,690 A | * | 6/1992 | Bianchi ........................ 326/87 |
| 5,194,763 A | * | 3/1993 | Suzuki et al. .................. 326/86 |
| 5,319,252 A | | 6/1994 | Pierce et al. ................. 327/170 |
| 5,491,432 A | * | 2/1996 | Wong et al. ................... 326/86 |
| 5,497,105 A | | 3/1996 | Oh et al. ....................... 326/27 |
| 5,701,072 A | * | 12/1997 | Jeon et al. .................... 327/384 |
| 5,739,707 A | * | 4/1998 | Barraclough ................. 327/112 |
| 5,838,177 A | | 11/1998 | Keeth .......................... 327/108 |
| 6,124,747 A | * | 9/2000 | Nasu ........................... 327/112 |
| 6,184,729 B1 | * | 2/2001 | Pasqualini .................. 327/112 |

* cited by examiner

*Primary Examiner*—Toan Tran
*Assistant Examiner*—Long Nguyen
(74) *Attorney, Agent, or Firm*—Pillsbury Winthrop LLP

(57) ABSTRACT

Ground bounce and power supply bounce are reduced in an output driver by utilizing a plurality of p-channel and n-channel driver transistors which are connected to an output pad, by insuring that the p-channel driver transistors are quickly and sequentially turned off before the n-channel transistors are slowly and sequentially turned on, and by insuring that the n-channel transistors are quickly and sequentially turned off before the p-channel transistors are slowly and sequentially turned on.

28 Claims, 9 Drawing Sheets

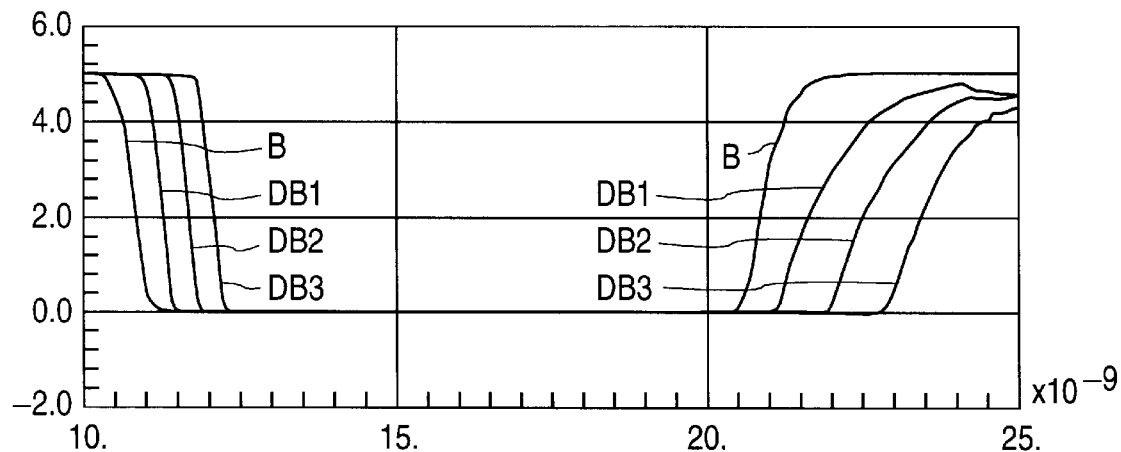
FIG. 7B
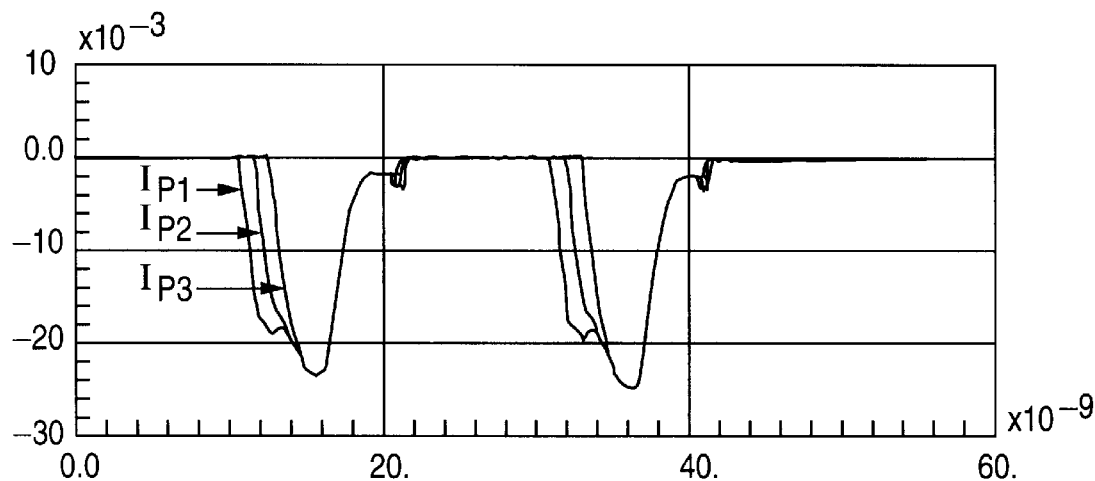
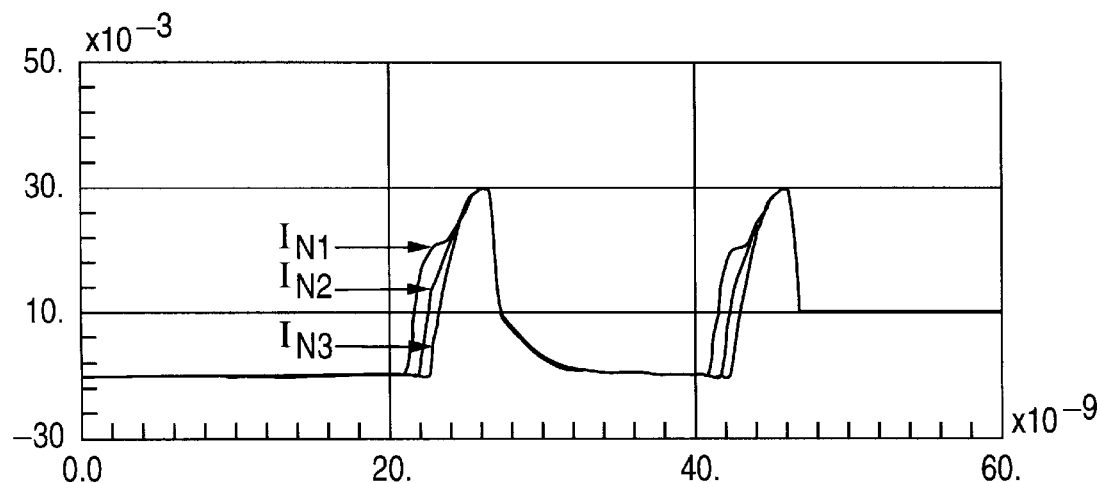
FIG. 7C

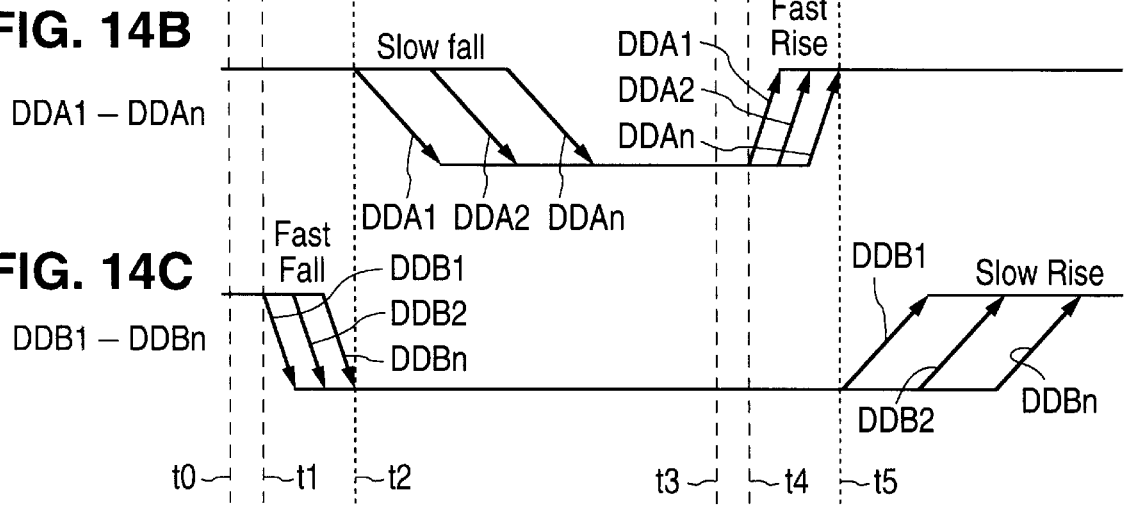
FIG. 14A IN
FIG. 14B DDA1 – DDAn
FIG. 14C DDB1 – DDBn
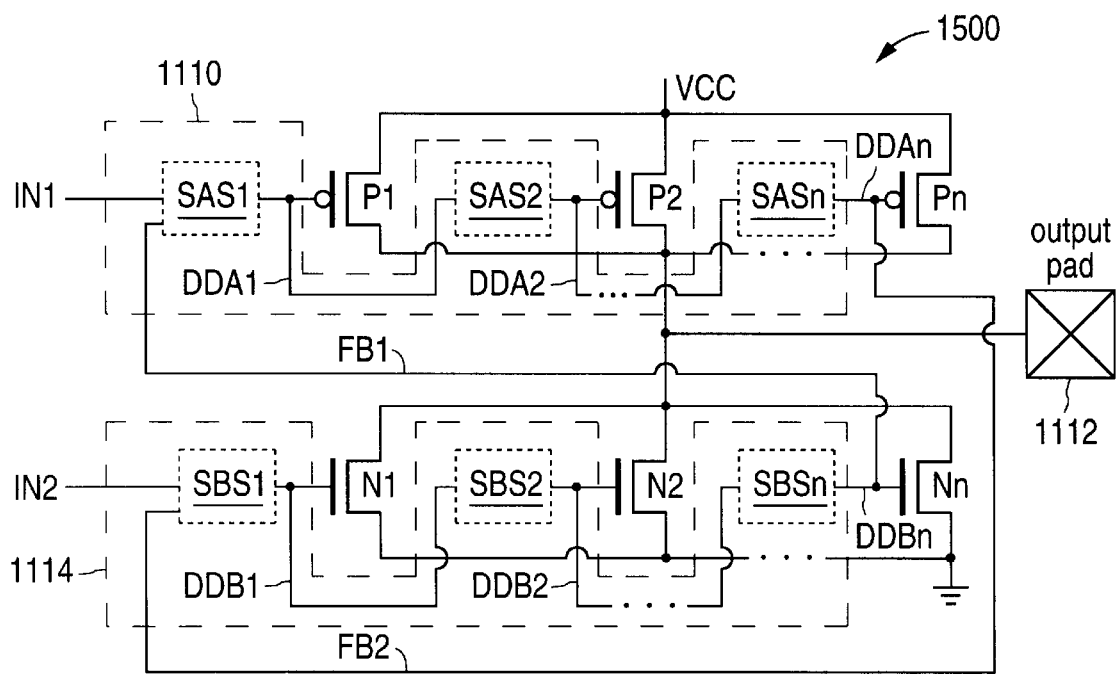
FIG. 15

LOW GROUND BOUNCE AND LOW POWER SUPPLY BOUNCE OUTPUT DRIVER WITH DUAL, INTERLOCKED, ASYMMETRIC DELAY LINES

RELATED APPLICATION

This application is a continuation-in-part of co-pending application Ser. No. 09/168,547 filed Oct. 8, 1998 by Ronald Pasqualini for Low Ground Bounce and Low Power Supply Bounce Output Driver.

BACKGROUND OF THE INVENTION

1. Field of the Invention

The present invention relates to output drivers and, more particularly, to a low ground bounce and low power supply bounce output driver with dual, interlocked, asymmetric delay lines.

2. Description of the Related Art

A CMOS digital output driver is a well known circuit that outputs a logic high or a logic low to a load capacitance by charging or discharging the load capacitance. In practice, several output drivers are often connected to the same ground (GND) line and the same power supply (VCC) line.

One of the problems associated with connecting several noisy (high di/dt) output drivers to the same ground line is that significant ground bounce (switching noise) can be generated when many (or all) of these output drivers discharge their load capacitances at the same time.

FIG. 1 shows a circuit diagram that illustrates a portion of a conventional output driver circuit 100. As shown in FIG. 1, driver circuit 100 includes a series of high di/dt output drivers driver#1–driver#N which each have a p-channel transistor 110 and an n-channel transistor 112.

Each p-channel transistor 110 has a source connected to a power supply VCC, a drain connected to is an output pad 114, and a gate. Each n-channel transistor 112 has a source connected to a common ground line 116, a drain connected to the drain of the p-channel transistor 110, and a gate.

During normal operation, when a single output driver is switched from a logic high to a logic low, a time varying current $i(t)_D$ from the load capacitance is placed on common ground line 116 as a result of the load capacitance being discharged. Similarly, when all of the output drivers driver#1—driver#N are simultaneously switched from a logic high to a logic low, a large time varying discharge current, which is the sum of the individual time varying discharge currents $i(t)_D$, is placed on common ground line 116.

The large time varying discharge current causes the voltage on common ground line 116 to vary due to the inductance of common ground line 116 (which is shown as an inductor L). As shown in EQ. 1, the voltage variation VLG on common ground line 116 is defined as follows:

$$VLG=L*N(di(t)_D/dt) \qquad \text{EQ. 1}$$

where L represents the inductance of common ground line 116 (including package inductance and bondwire inductance), N represents the number of drivers driver#1–driver#N that are discharging their load capacitances at the same time, and di(t)/dt represents the time varying discharge current $i(t)_D$ through a single driver.

Thus, as shown in EQ. 1, extremely high ground bounce (switching noise) can be generated when several drivers driver#1–driver#N are switched from a logic high to a logic low at the same time.

Similarly, a significant power supply bounce (switching noise) can be generated when several noisy (high di/dt) output drivers charge their load capacitances from the same power supply line at the same time.

FIG. 2 shows a circuit diagram that illustrates a portion of a conventional output driver circuit 200. Output driver circuit 200 is similar to output driver circuit 100 and, as a result, utilizes the same reference numerals to designate the structures which are common to both circuits.

In addition to the elements of circuit 100, output driver circuit 200 also includes a common power supply line 210 which is connected to the source of the p-channel transistor 110 in each of the output drivers driver#1–driver#N.

During normal operation, when a single output driver is switched from a logic low to a logic high, a time varying charge current $i(t)_c$ from the VCC power supply is placed on common power supply line 210, as a result of the load capacitance being charged. Similarly, when all of the output drivers driver#1–driver#N are simultaneously switched from a logic low to a logic high, a large time varying charge current from the VCC power supply is placed on common power supply line 210. This time varying current is the sum of the individual time varying charge currents $i(t)_c$.

The large time varying current causes the voltage on common power supply line 210 to also vary due to the inductance of line 210 (shown as inductor L). As shown in EQ. 2, the voltage variation VLV on common power supply line 210 is defined as follows:

$$VLV=L*N(di(t)_c/dt) \qquad \text{EQ. 2}$$

where L represents the inductance of power supply line 210 (including package inductance and bondwire inductance), N represents the number of drivers driver#1–driver#N that are charging their load capacitances at the same time, and di(t)/dt represents a single time varying charge current $i(t)_c$.

Thus, as shown in EQ. 2, extremely high power supply bounce (switching noise) can be generated when several drivers driver#1–driver#N are switched from a logic low to a logic high at the same time.

The parent invention minimized ground bounce and power supply bounce with an output driver that utilized a number of p-channel driver transistors in lieu of a single p-channel driver transistor, and a number of n-channel driver transistors in lieu of a single n-channel driver transistor.

In addition, the output driver of the parent invention utilized a first delay line to sequentially turn on and turn off of the p-channel driver transistors, and a second delay line to sequentially turn on and turn off of the n-channel driver transistors. In addition, the p-channel and n-channel driver transistors are turned on slowly, and turned off quickly.

To further minimize bounce in the parent invention, none of the p-channel driver transistors are preferably turned on when an n-channel driver transistor is turned on, and none of the n-channel driver transistors are preferably turned on when a p-driver channel transistor is turned on. One problem with the parent invention, however, is that it is difficult to set up the timing to insure that the p-channel and n-channel driver transistors are not turned on at the same time.

Thus, there is a need for an output driver that slowly turns on and quickly turns off the p-channel driver transistors in sequence, slowly turns on and quickly turns off the n-channel driver transistors in sequence, and insures that the p-channel and n-channel driver transistors are not turned on at the same time.

SUMMARY OF THE INVENTION

Conventionally, noisy (high di/dt) output drivers can generate significant ground bounce and power supply bounce whenever they switch from high to low or from low to high at the same time. The present invention reduces ground bounce and power supply bounce with an output driver that utilizes a number of p-channel driver transistors in lieu of a single p-channel driver transistor, and a number of n-channel driver transistors in lieu of a single n-channel driver transistor.

In addition, the output driver of the present invention utilizes dual, interlocked, asymmetric delay lines to slowly turn on and quickly turn off the p-channel driver transistors in sequence, and slowly turn on and quickly turn off the n-channel driver transistors in sequence. In accordance with the present invention, the dual, interlocked, asymmetric delay lines insure that the p-channel and n-channel driver transistors are not turned on at the same time.

The present invention is especially useful for implementing fast, high current output drivers that must drive high capacitive loads, such as PCI bus drivers. In addition, mixed signal (analog/digital) chips will greatly benefit from the reduced switching noise (bounce) that occurs on the VCC and ground lines.

An output driver in accordance with the present invention includes a first delay line. The first delay line has a plurality of first delay stages that output a corresponding plurality of delayed first signals. The first delay line is connectable to receive a number of first control signals, and connected to receive a number of first feedback signals. The output driver also includes a plurality of first driver transistors which are each connected to a first delay stage to receive a delayed first signal.

Further, the output driver includes a second delay line. The second delay line has a plurality of second delay stages that output a corresponding plurality of delayed second signals. The second delay line is connectable to receive a number of second control signals, and connected to receive a number of second feedback signals. A delayed first signal sets the logic state of a second feedback signal, while a delayed second signal sets the logic state of a first feedback signal.

The output driver of the present invention additionally includes a plurality of second driver transistors that are each connected to receive a delayed second signal. In addition, the second driver transistors are connected to the first driver transistors.

During normal operation, the first delay stages sequentially turn off the plurality of p-channel driver transistors before the second delay stages sequentially turn on the plurality of n-channel driver transistors. Furthermore, the second delay stages sequentially turn off the plurality of n-channel driver transistors before the first delay stages sequentially turn on the plurality of p-channel driver transistors.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIGS. 7A and 7B are waveform diagrams illustrating the real-world operation of circuit 600 in accordance with the parent invention.

FIG. 7C is another waveform diagram illustrating the real-world operation of circuit 600 in accordance with the parent invention.

FIGS. 14A–14C are waveform diagrams illustrating a high speed application of circuit 1100 in accordance with the present invention. FIG. 14A shows the input signal IN, FIG. 14B shows the signals DDA1–DDAn output from delay stages SAS1–SASn, and FIG. 14C shows the signals DDB1–DDBn output from delay stages SBS1–SBSn.

FIG. 15 is a circuit diagram illustrating a low ground bounce/low power supply bounce output driver 1500 in accordance with the present invention.

DESCRIPTION OF THE PRESENT INVENTION

Figure 3:
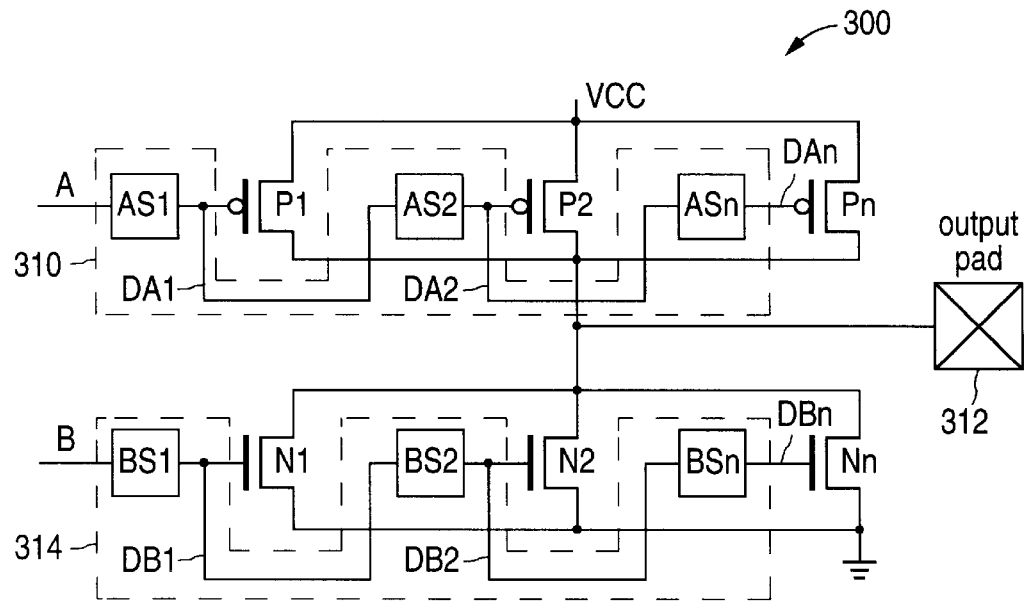
FIG. 3 is a circuit diagram illustrating a low ground bounce/low power supply bounce output driver 300 in accordance with the parent invention.

FIG. 3 shows a circuit diagram that illustrates a low ground bounce/low power supply bounce output driver 300 in accordance with the parent invention. As shown in FIG. 3, driver 300 includes a first delay circuit 310 that has an input which is connected to receive a first input signal A, and a series of serially-connected delay stages AS1–ASn. Delay stages AS1–ASn, in turn, output a corresponding series of delayed first signals DA1–DAn which change logic states at different times after the logic state of the first input signal A changes state.

As further shown in FIG. 3, driver 300 also includes a series of p-channel MOS driver transistors P1–Pn each of which has a source connected to a power supply VCC, a drain connected to an output pad 312, and a gate connected to receive one of the delayed first signals DA1–DAn.

In addition, driver 300 further includes a second delay circuit 314 that has an input which is connected to receive a second input signal B, and a series of serially-connected delay stages BS1–BSn. (The input of delay circuit 310 and the input of delay circuit 314 can be connected together when a switchable high impedance buffer, such as a TRI-STATE™ buffer, is not being implemented).

Delay stages BS1–BSn output a corresponding series of delayed second signals DB1–DBn which change logic states at different times after the logic state of the second input signal B changes state.

Furthermore, driver 300 additionally includes a series of n-channel MOS driver transistors N1–Nn which each of which has a source connected to a common ground, a drain connected to output pad 312, and a gate connected to receive one of the delayed second signals DB1–DBn.

Figure 4:
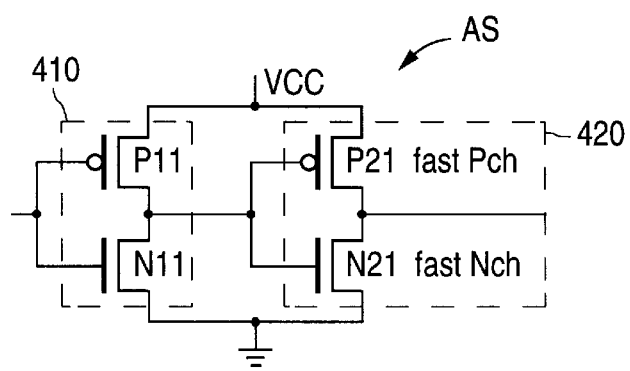
FIG. 4 is a circuit diagram illustrating a first delay circuit AS in accordance with the parent invention.
Figure 5:
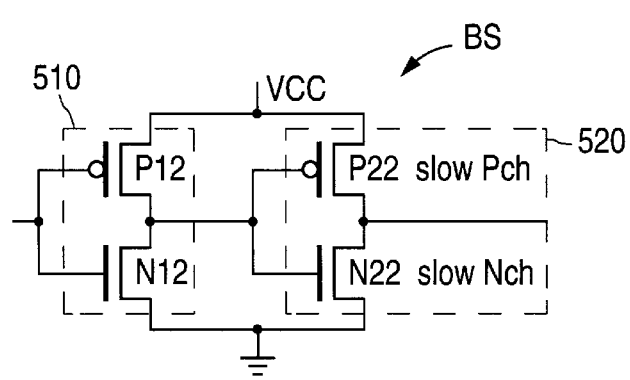
FIG. 5 is a circuit diagram illustrating a second delay circuit ES in accordance with the parent invention.

FIG. 4 shows a circuit diagram that illustrates a delay stage AS in accordance with the parent invention. FIG. 5 shows a circuit diagram that illustrates a delay stage BS in accordance with the parent invention.

As shown in FIG. 4, stage AS, which is non-inverting, includes two inverters in series, a first inverter 410 and a second inverter 420. As further shown in FIG. 4, inverter 410 includes a p-channel transistor P11 and an n-channel transistor N11, while inverter 420 includes a p-channel transistor P21 and an n-channel transistor N21.

Although transistors P11 and N11 of inverter 410 have ordinary W/L ratios, the W/L ratios of transistors P21 and N21 of inverter 420 are highly skewed so that transistor P21 is a relatively strong transistor and transistor N21 is a relatively weak transistor. Thus, p-channel transistor P21 is formed to provide a very fast charge time, and n-channel transistor N21 is formed to provide a relatively slow discharge time.

The aforementioned asymmetry ensures that the output rise time of inverter 420 will be much faster than the output fall time of inverter 420. Therefore, because inverter 420 directly drives transistors P1–Pn in FIG. 3, each p-channel transistor P1–Pn will turn off very fast, and will turn on relatively slowly.

Similarly, as shown in FIG. 5, each stage ES, which is non-inverting, includes two inverters in series, a first inverter 510 and a second inverter 520. As further shown in FIG. 5, inverter 510 includes a p-channel transistor P12 and an n-channel transistor N12, while inverter 520 includes a p-channel transistor P22 and an n-channel transistor N22.

Although transistors P12 and N12 of inverter 510 have ordinary W/L ratios (like transistors P11 and N11 of inverter 410), the W/L ratios of transistors P22 and N22 of inverter 520 are highly skewed so that transistor P22 is a relatively weak transistor and transistor N22 is a relatively strong transistor. Thus, p-channel transistor P22 is formed to provide a relatively slow charge time, and n-channel transistor N22 is formed to provide a very fast discharge time.

The aforementioned asymmetry ensures that the output fall time of inverter 520 will be much faster than the output rise time of inverter 520. Therefore, because inverter 520 directly drives transistors N1–Nn in FIG. 3, each n-channel transistor N1–Nn will turn off very fast and will turn on relatively slowly.

During normal circuit operation, delay circuits 310 and 314 work together to ensure that current spikes cannot occur from VCC to ground due to one or more p-channel transistors P1–Pn being on while one or more n-channel transistors N1–Nn are also on at the same time.

Thus, if the n-channel transistors N1–Nn are initially on and the p-channel transistors P1–Pn are initially off, delay circuit 314 will turn off all of the n-channel transistors N1–Nn before delay circuit 310 turns on any of the p-channel transistors P1–Pn.

Conversely, if the p-channel transistors P1–Pn are initially on and the n-channel transistors N1–Nn are initially off, delay circuit 310 will turn off all of the p-channel transistors before delay circuit 314 turns on any of the n-channel transistors N1–Nn.

In addition to preventing VCC-to-ground current spikes, delay circuits 310 and 314 also provide another extremely critical circuit function: they turn on the p-channel transistors P1–Pn and the n-channel transistors N1–Nn relatively slowly. This slow turn-on is absolutely essential to achieving low ground/VCC bounce.

Figure 6:
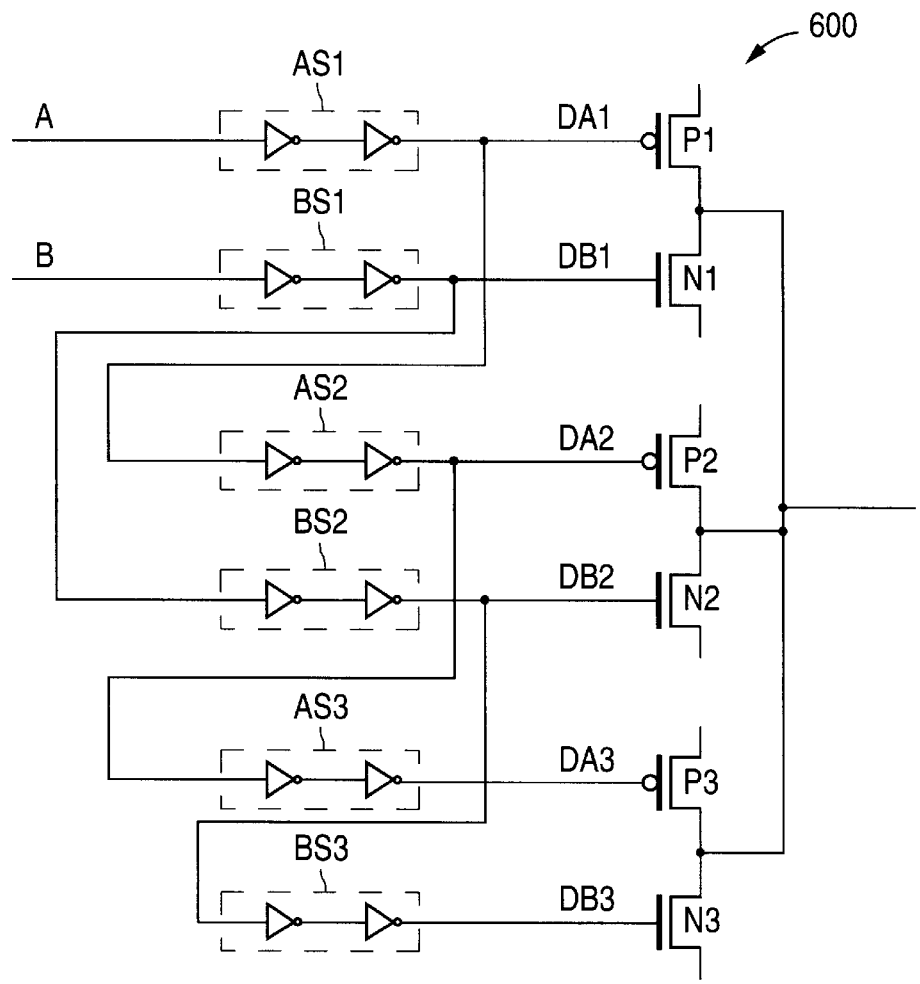
FIG. 6 is a circuit diagram illustrating an output driver circuit 600 in accordance with the parent invention.

FIG. 6 shows a circuit diagram that illustrates an output driver circuit 600 in accordance with the parent invention. Output driver circuit 600 is similar to output driver circuit 300 and, as a result, utilizes the same reference numerals to designate the structures which are common to both circuits.

Output driver circuit 600 primarily differs from output driver circuit 300 in that circuit 600 utilizes three delay stages AS1–AS3 to form delay circuit 310, three delay stages BS1–BS3 to form delay circuit 314, three p-channel driver transistors P1–P3, and three n-channel driver transistors N1–N3.

Figure 7A:
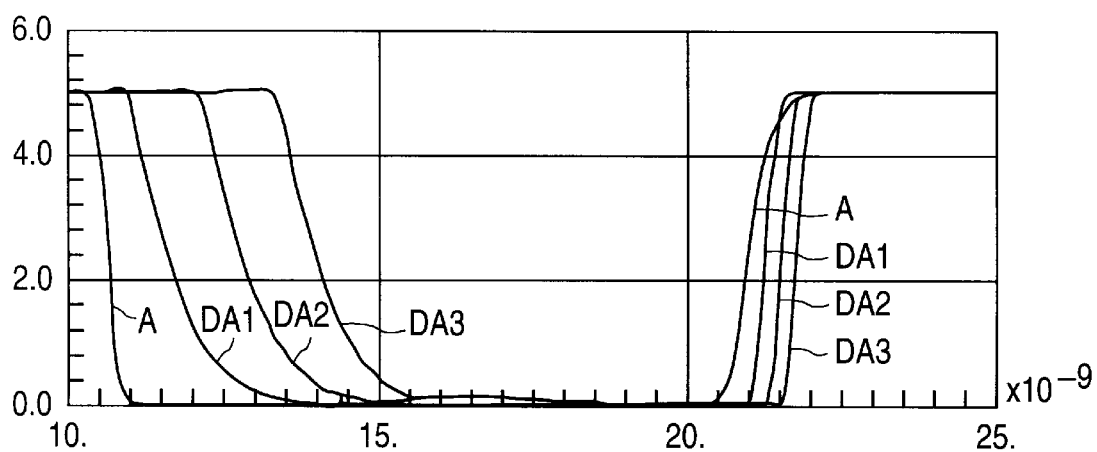

FIGS. 7A and 7B show waveform diagrams which illustrate a high speed application of circuit 600 in accordance with the parent invention. As shown in FIGS. 7A and 7B, the DB3 waveform (taken from the output of delay stage BS3) falls and turns off the last n-channel driver transistor N3 before the DA1 waveform (taken from the output of delay stage AS1) has fallen to turn on the initial p-channel driver transistor P1. This behavior prevents current spikes from occurring when the output pad is being charged up to the logic one level.

Similarly, the DA3 waveform rises to turn off the last p-channel driver transistor P3 before the DB1 waveform rises to turn on the initial n-channel driver transistor N1. This behavior prevents current spikes from occurring when the output pad is being discharged to the logic zero level.

Referring to FIG. 6, the drain currents of transistors P1–P3 are defined to be $I_{p1}$–$I_{p3}$. Similarly, the drain currents of transistors N1–N3 are defined to be $I_{N1}$–$I_{N3}$. These currents are plotted vs time in FIG. 7C.

As shown in FIG. 7C, $I_{p1}$–$I_{p3}$ are staggered in time, reducing the peak charging current through the output load capacitance. Similarly, $I_{N1}$–$IN_3$ are also staggered in time, reducing the peak discharging current through the output load capacitance. This time staggering reduces the peak di/dt in the ground line inductance and the VCC line inductance, reducing the peak ground bounce voltage and the peak VCC bounce voltage. Note, from FIG. 7C, that none of the $I_{p1}$–$I_{p3}$ currents overlap any of the $I_{N1}$–$I_{N3}$ currents in time. Thus VCC to ground current spikes are prevented, minimizing the peak ground/VCC bounce voltages.

Note, from FIGS. 7A–7B, that the fall times of the DA1–DA3 waveforms are considerably slower than their rise times. These slow fall times ensure that the p-channel driver transistors P1, P2, and P3 will be turned on slowly, thereby reducing VCC bounce.

Similarly, note from FIGS. 7A–7B, that the rise times of the DB1–DB3 waveforms are considerably slower than their fall times. These slow rise times ensure that the n-channel driver transistors N1, N2, and N3 will be turned on slowly, thereby reducing ground bounce.

Figure 8:
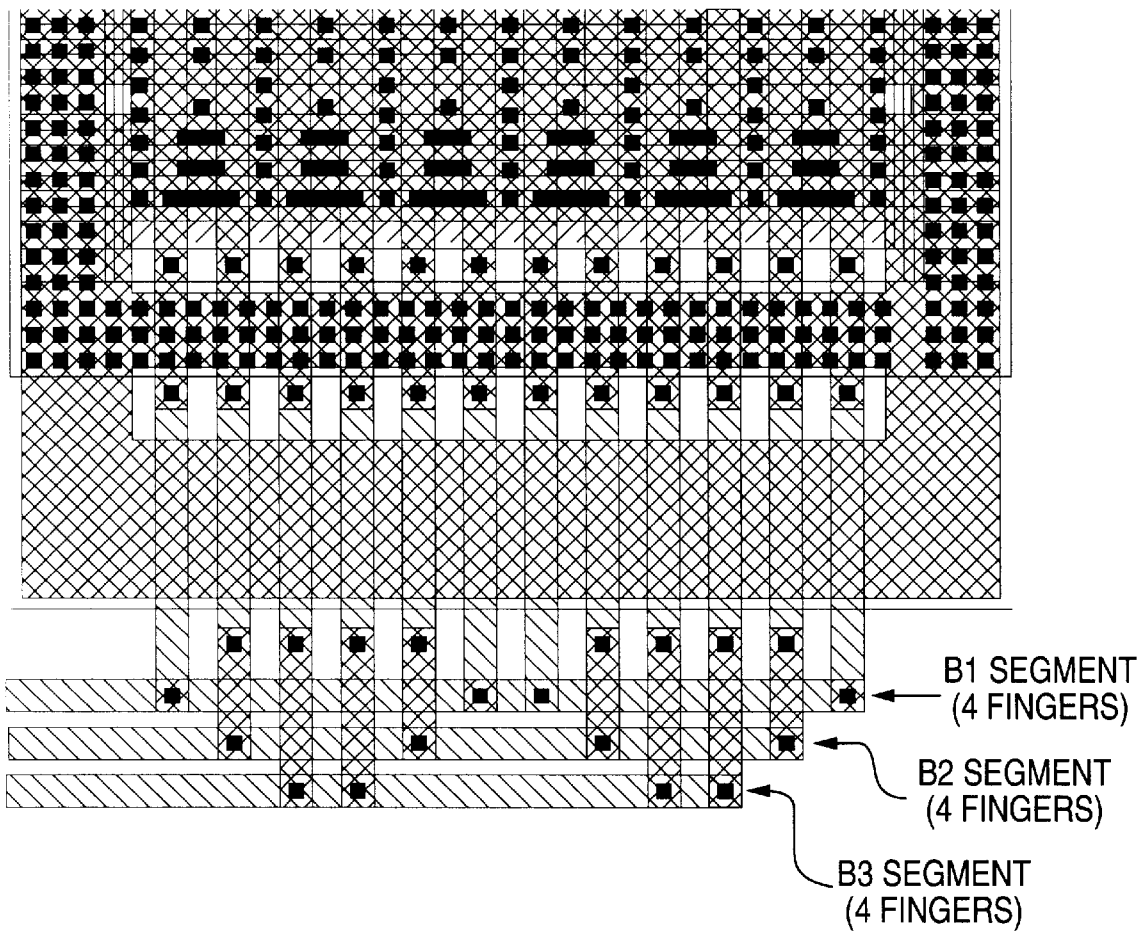
FIG. 8 is a plan view illustrating a layout for the n-channel output transistors where the gates of is the transistors N1, N2, and N3 each have four 'fingers' in accordance with the parent invention.

Although the parent invention utilizes multiple p-channel and n-channel driver transistors P1–Pn and N1–Nn, these transistors can be laid out in a highly compact manner. Thus, the three p-channel driver transistors P1, P2, and P3, and the three n-channel driver transistors N1, N2, and N3 shown in FIG. 6 can be compactly laid out as if they were only two transistors instead of six. An example of this compact layout for the n-channel driver transistors is shown in FIG. 8 where the gates of transistors N1, N2, and N3 each have four 'fingers'.

One of the advantages of the parent invention is that output driver 300 employs dual delay line circuits to simultaneously minimize ground bounce and VCC bounce. The asymmetric nature of these dual delay line circuits provides two means of minimizing ground bounce and VCC bounce.

First, the p-channel and n-channel driver transistors P1–Pn and N1–Nn are turned on very slowly, thereby minimizing the peak di/dt in the output inductance and the output capacitance. Second, current spikes are prevented from occurring when the p-channel and n-channel driver transistors change state, despite the fact that these transistors are being turned on very slowly. (In those circuits which allow current spikes to occur, ground and VCC bounce is actually increased, which is the direct opposite of what is required).

Since the dual delay line circuits provide asymmetric rise/fall delays, they allow output driver 300 to have a shorter propagation delay in comparison to circuits which slow down the rising and failing edges of the pre-driver stage(s) by approximately the same amount.

In addition, a precision current reference or voltage reference is not required. Use of such references usually requires slow, expensive (and sometimes unreliable) trimming procedures.

Furthermore, the multi-stage delay line circuits provide a stair-step approximation to an ideal current ramp flowing in the output inductance and the output capacitance. This is not the case for circuits which employ only a single stage of delay in the pre-driver.

The minimum amount of ground bounce which can be achieved by any given bounce control circuit depends upon the following five circuit parameters: 1) L, the ground line inductance; 2) CL, the load capacitance which must be discharged; 3) N, the number of output buffers which must simultaneously switch from a logic one to a logic zero on the same ground line; 4) $\Delta V$, the required output voltage swing (from VCC to the logic zero level); and 5) $\Delta T$, the required discharge time (output buffer propagation delay).

Therefore, ground bounce will increase if L, CL, N, or $\Delta V$ are increased, or if $\Delta T$ is decreased. Conversely, ground bounce will decrease if L, CL, N, or $\Delta V$ are decreased, or if $\Delta T$ is increased. Ground bounce is inversely proportional to $\Delta T$ squared.

Figure 9A:
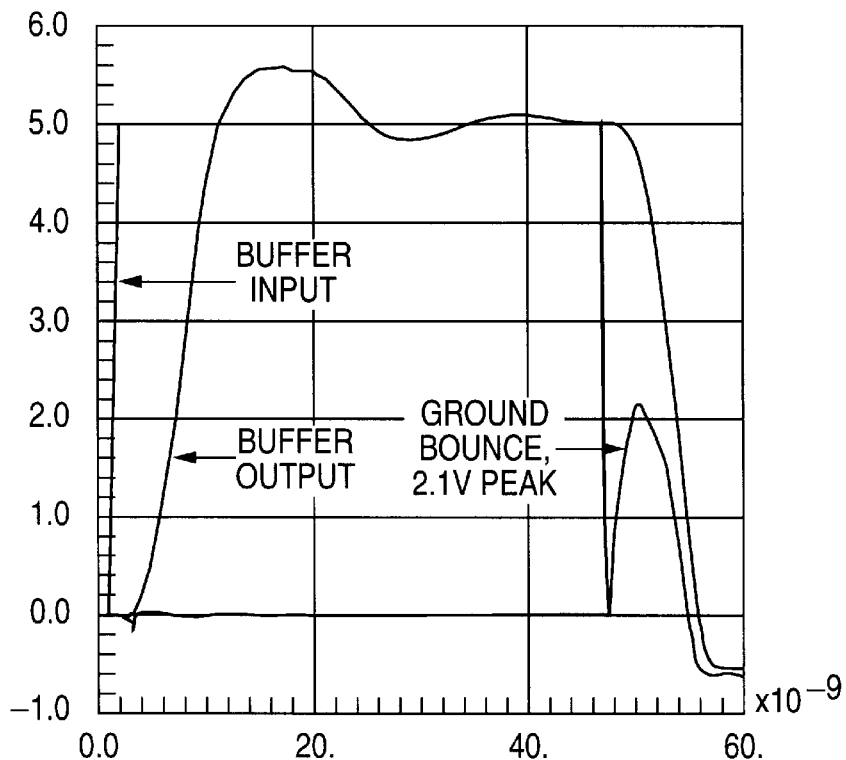
FIGS. 9A and 9B are waveform diagrams illustrating the ground-bounce advantages of the parent invention.
Figure 9B:
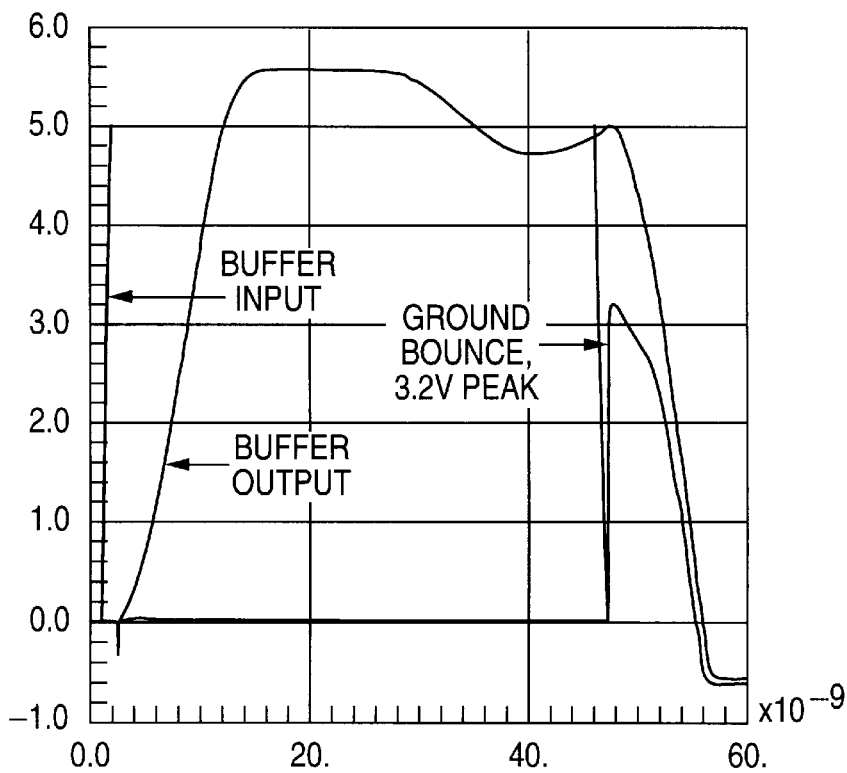

FIGS. 9A and 9B show ground bounce waveforms that illustrate the ground bounce advantages of the parent invention for the following five values of the circuit parameters enumerated above: 1) L=10 nh; 2) CL=100 pf; 3) N=8 buffers; 4) $\Delta V$=3.5V (5V–1.5V); and 5) $\Delta T$=7 ns.

Figure 1:
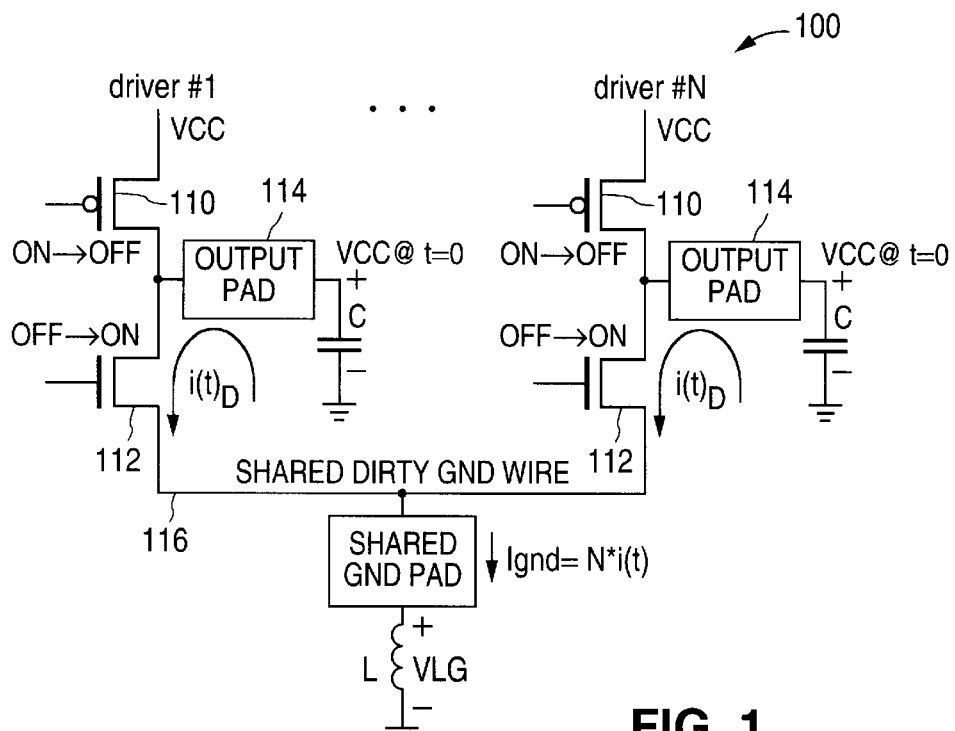
FIG. 1 is a circuit diagram illustrating a portion of a conventional output driver circuit 100.
Figure 2:
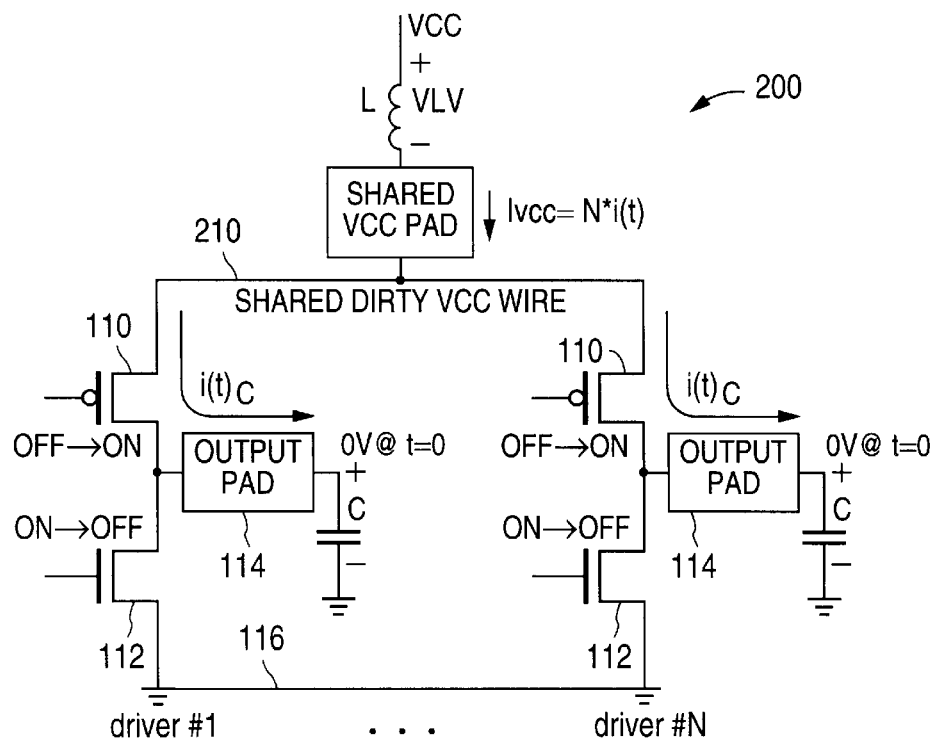
FIG. 2 is a circuit diagram illustrating a portion of a conventional output driver circuit 200.

As shown in FIGS. 9A and 9B, the ground bounce is 2.1V when output driver 300 of the parent invention is used, while the ground bounce is substantially higher (3.2V) when a conventional driver, such as driver 100 of FIG. 1, is used.

The minimum amount of VCC bounce which can be achieved by any given bounce control circuit depends upon the following five circuit parameters: 1) L, the VCC line inductance; 2) CL, the load capacitance which must be charged up; 3) N, the number of output buffers which must simultaneously switch from a logic zero to a logic one on the same VCC line; 4) $\Delta V$, the required output voltage swing (from ground to the logic one level); and 5) $\Delta T$, the required charge time (output buffer propagation delay).

Therefore, VCC bounce will increase if L, CL, N, or $\Delta V$ are increased, or if AT is decreased. Conversely, VCC bounce will decrease if L, CL, N, or $\Delta V$ are decreased, or if $\Delta T$ is increased. VCC bounce is inversely proportional to $\Delta T$ squared.

Figure 10A:
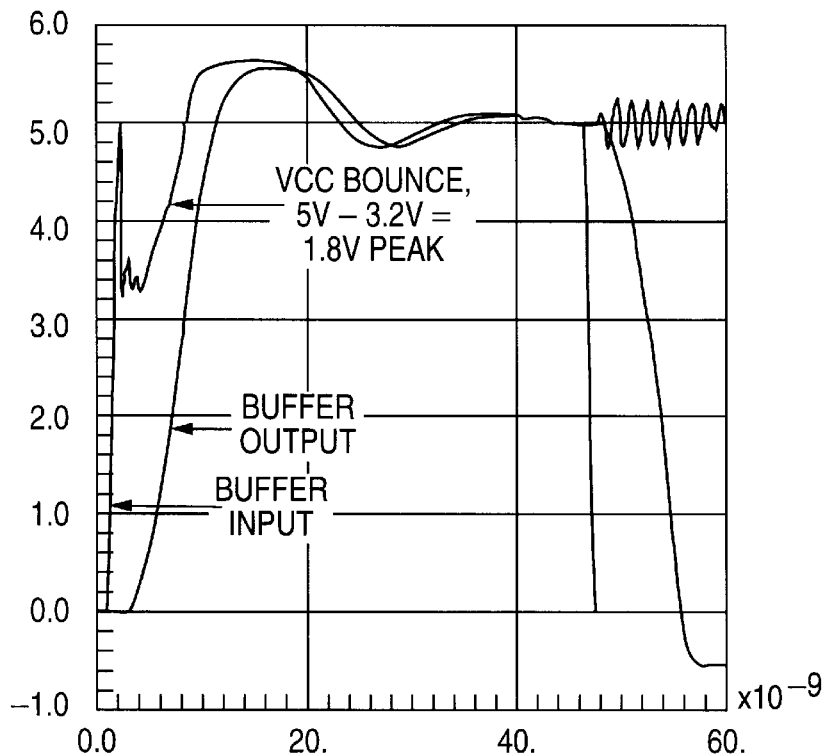
FIGS. 10A and 10B are waveform diagrams illustrating the VCC-bounce advantages of the parent invention.
Figure 10B:
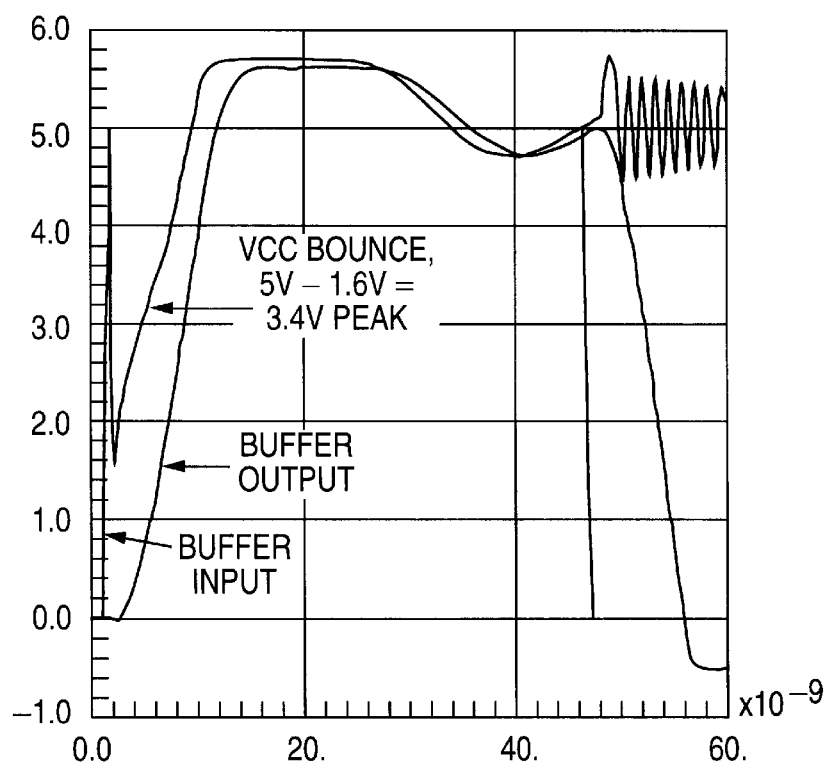

FIGS. 10A and 10B show VCC bounce waveforms that illustrate the VCC bounce advantages of the parent invention for the following five values of the circuit parameters enumerated above: 1) L=10 nh; 2) CL=100 pf; 3) N=8 buffers; 4) $\Delta V$=1.5V (1.5V–0V); and 5) $\Delta T$=7 ns.

As shown in FIGS. 10A and 10B, the VCC bounce is 1.8V (5.0V–3.2V=1.8V) when the parent invention is used, while the VCC bounce is substantially higher (5V–1.6V=3.4V), when the parent invention is not used.

Figure 11:
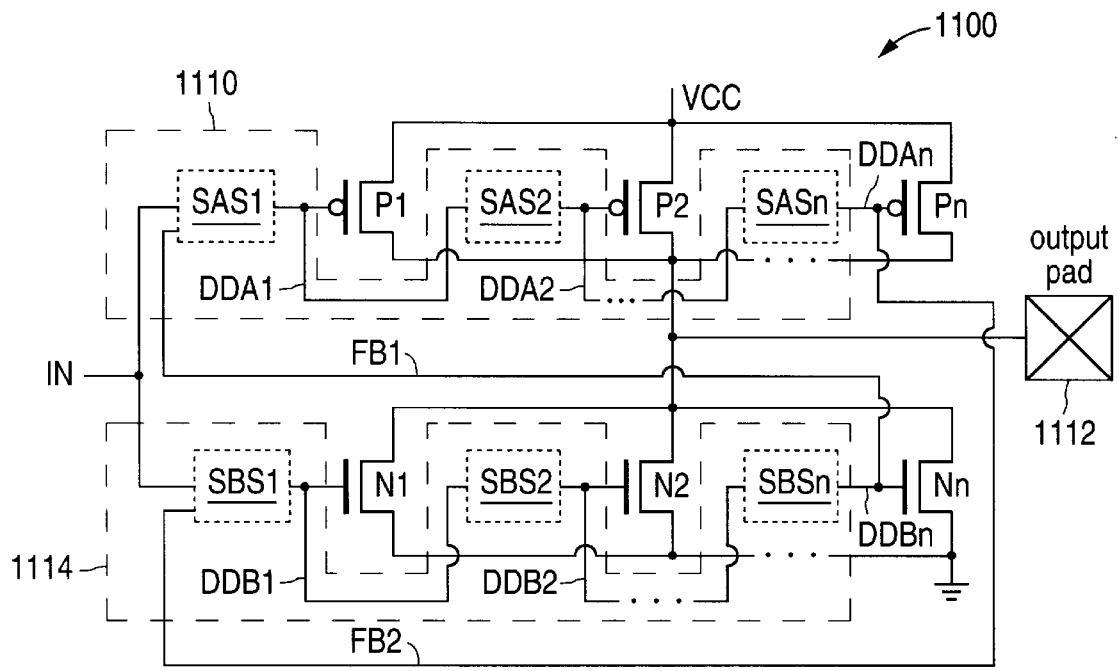
FIG. 11 is a circuit diagram illustrating a low ground bounce/low power supply bounce output driver 1100 in accordance with the present invention.

FIG. 11 shows a circuit diagram that illustrates a low ground bounce/low power supply bounce output driver 1100 in accordance with the present invention. As described in greater detail below, driver 1100 minimizes ground bounce and power supply bounce while operating at high frequencies by turning on multiple output transistors in a sequential fashion, and by providing slow transistor turn on, fast transistor turn off, and a zero crowbar current.

As shown in FIG. 11, driver 1100 includes a p-channel delay line 1110 that includes a series of delay stages SAS1–SASn. The first delay stage SAS in the series is connectable to receive an input signal IN, and connected to receive a feedback signal FB1. In addition, the delay stages SAS1–SASn output a corresponding series of delayed gate signals DDA1–DDAn such that each delay stage SAS outputs a delayed gate signal DDA.

Driver 1100 also includes a series of p-channel MOS driver transistors P1–Pn which each have a source connected to a power supply VCC, a drain connected to an output pad 1112, and a gate connected to receive a delayed gate signal DDA of the series.

In order to reduce VCC bounce, the p-channel driver transistors P1–Pn must not be turned on simultaneously. Thus, transistor P1 must be turned on first, transistor P2 must be turned on second, and transistor Pn must be turned on last.

Delay line 1110 provides this timing by setting the logic state of the delayed gate signal DDA1 to a logic low to turn on transistor P1 a delay time after the logic states of the input signal IN and the feedback signal FB1 have satisfied a first predetermined logic condition.

A delay time after the logic state of the delayed gate signal DDA1 has been changed, delay line 1110 sets the logic state of the delayed gate signal DDA2 to a logic low which, in turn, turns on transistor P2. Similarly, a delay time after the logic state of the delayed gate signal DDA2 has been changed, delay line 1110 sets the logic state of the delayed gate signal DDAn to a logic low which, in turn, turns on transistor Pn. Thus, transistors P1–Pn sequentially turn on after the first logic condition has been satisfied.

Delay line 1110 also sets the logic state of the delayed gate signal DDA1 to a logic high to turn off transistor P1 a delay time after the logic states of the input signal IN and the feedback signal FB1 have satisfied a second predetermined logic condition.

A delay time after the logic state of the delayed gate signal DDA1 has been changed, delay line 1110 sets the logic state of the delayed gate signal DDA2 to a logic high which, in turn, turns off transistor P2. Similarly, a delay time after the logic state of the delayed gate signal DDA2 has been changed, delay line 1110 sets the logic state of the delayed gate signal DDAn to a logic high which, in turn, turns off transistor Pn. Thus, transistors P1–Pn sequentially turn off after the second logic condition has been satisfied.

Driver 1100 further includes an n-channel delay line 1114 that includes a series of delay stages SBS1–SBSn. The first delay stage SBS in the series is connectable to receive the input signal IN, and connected to receive a feedback signal FB2. In addition, the delay stages SBS1–SBSn output a corresponding series of delayed gate signals DDB1–DDBn such that each delay stage SBS outputs a delayed gate signal DDB.

Driver 1100 also includes a series of n-channel MOS driver transistors N1–Nn which each have a source connected to a power supply VCC, a drain connected to an output pad 1112, and a gate connected to receive a delayed gate signal DDB of the series.

In order to reduce ground bounce, the n-channel driver transistors N1–Nn must not be turned on simultaneously. Thus, transistor N1 must be turned on first, transistor N2 must be turned on second, and transistor Nn must be turned on last.

Delay line 1114 provides this timing by setting the logic state of the delayed gate signal DDB1 to a logic high to turn on transistor N1 a delay time after the logic states of the input signal IN and the feedback signal FB1 have satisfied a third predetermined logic condition.

A delay time after the logic state of the delayed gate signal DDB1 has been changed, delay line 1114 sets the logic state of the delayed gate signal DDB2 to a logic high which, in turn, turns on transistor N2. Similarly, a delay time after the logic state of the delayed gate signal DDB2 has been changed, delay line 1114 sets the logic state of the delayed gate signal DDBn to a logic high which, in turn, turns on transistor Nn. Thus, transistors N1–Nn sequentially turn on after the third logic condition has been is satisfied.

Delay line 1114 also sets the logic state of the delayed gate signal DDB1 to a logic low to turn off transistor N1 a delay time after the logic states of the input signal IN and the feedback signal FB1 have satisfied a fourth predetermined logic condition.

A delay time after the logic state of the delayed gate signal DDB1 has been changed, delay line 1114 sets the logic state of the delayed gate signal DDB2 to a logic low which, in turn, turns off transistor N2. Similarly, a delay time after the logic state of the delayed gate signal DDB2 has been changed, delay line 1114 sets the logic state of the delayed gate signal DDBn to a logic low which, in turn, turns off transistor Nn. Thus, transistors N1–Nn sequentially turn off after the fourth logic condition has been satisfied.

In accordance with the present invention, delay lines 1110 and 1114 are interlocked by utilizing the last delayed gate signal DDAn to set the logic state of the second feedback signal FB2, and the last delayed gate signal DDBn to set the logic state of the first feedback signal FB1.

Using the first and second feedback signals FB1 and FB2, the logic conditions are defined so that none of the p-channel driver transistors P1–Pn will turn on until all of the n-channel driver transistors N1–Nn are turned off. Similarly, the logic conditions are defined so that none of the n-channel driver transistors N1–Nn will turn on until all of the p-channel driver transistors P1–Pn are turned off.

Where moderate VCC bounce is acceptable, such as for medium speed applications, the strengths of the p-channel driver transistors P1–Pn can be made identical. However, for high speed, low VCC bounce applications, it is usually best to individually adjust the sizes of the p-channel driver transistors P1–Pn.

VCC bounce is a peak phenomenon. Because of this, and because transistor P1 turns on first, it is usually best to make transistor P1 the weakest driver transistor in order to minimize the peak rate of change of the current in the output driver.

Similarly, transistor P2 can be made somewhat stronger than transistor P1 since it turns on second at a time when the rate of change of the current is slowing down. Transistor Pn can be somewhat stronger than transistor P2 since transistor Pn turns on last at a time when the rate of change of the output driver current is relatively low.

Where moderate ground bounce is acceptable, such as for medium speed applications, the strengths of the n-channel driver transistors N1–Nn can be made identical. However, for high speed, low ground bounce applications, it is usually best to individually adjust the sizes of the n-channel driver transistors N1–Nn.

Ground bounce is also a peak phenomenon. Because of this, and because transistor N1 turns on first, it is usually best to make transistor N1 the weakest driver transistor in order to minimize the peak rate of change of the current in the output driver.

Similarly, transistor N2 can be made somewhat stronger than transistor N1 since it turns on second at a time when the rate of change of the current is slowing down. Transistor Nn can be somewhat stronger than transistor N2 since transistor Nn turns on last at a time when the rate of change of the output driver current is relatively low.

In addition, to sequentially turning on the p-channel and n-channel driver transistors P1–Pn and N1–Nn, the present invention also allows the p-channel and n-channel driver transistors P1–Pn and N1–Nn to be turned on slowly and turned off quickly.

When driver transistors are slowly turned on, however, a switching current, known as a crowbar current, can flow directly from VCC to ground through the driver transistors. The present invention utilizes the interlocked delay lines to insure that none of the p-channel driver transistors P1–Pn will turn on until all of the n-channel driver transistors N1–Nn are turned off.

Similarly, the interlocked delay lines insure that none of the n-channel driver transistors N1–Nn will turn on until all of the p-channel driver transistors P1–Pn are turned off. As a result, the present invention eliminates the crowbar current.

Figure 12:
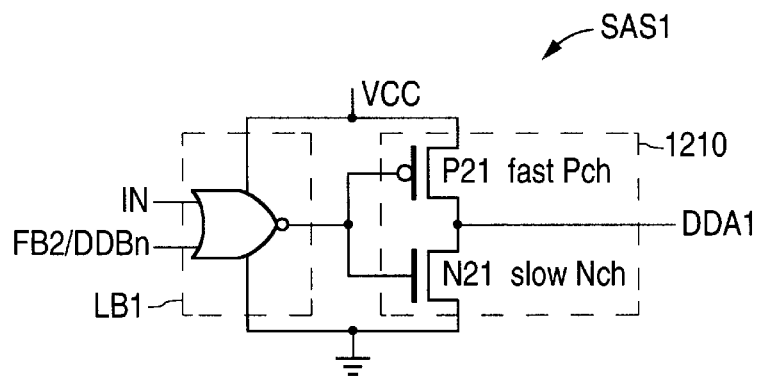
FIG. 12 is a circuit diagram illustrating an example of initial delay stage SAS1 in accordance with the present invention.

FIG. 12 shows a circuit diagram that illustrates an example of initial delay stage SAS1 in accordance with the present invention. As shown in FIG. 12, delay stage SAS1 includes a logic block LB1 that has a first input that is connectable to receive the input signal IN, a second input that is connected to receive the feedback signal FB2, and an output. In the preferred embodiment of the present invention, logic block LB1 is implemented with a NOR gate (other logic circuits may alternately be used).

As further shown in FIG. 12, delay stage SAS1 also includes an inverter 1210 that has an input connected to the output of logic block LB1, and an output that outputs delayed gate signal DDA1. In the present invention, inverter 1210 is formed to be the same as inverter 420. Logic block LB1 (the NOR gate) in combination with inverter 1210 makes initial delay stage SAS1 non-inverting.

Delay stages SAS2–SASn are formed to be the same as delay stage AS shown in FIG. 4. As noted above, delay stage AS has a first inverter 410 and a second inverter 420. The NOR gate of delay stage SAS1 and the first inverters 410 of delay stages SAS2–SASn can be implemented as ordinary CMOS gates with no special strong or weak transistor sizing requirements.

Inverter 1210 (420) of stage SAS1 and inverters 420 of stages SAS2–SASn, on the other hand, are implemented using a relatively strong (large) p-channel transistor P21 and a relatively weak (small) n-channel transistor N21.

The weak n-channel transistor N21 of inverter 420 produces a relatively slow fall time (a slow discharge time). The slow fall time slowly turns on the corresponding p-channel driver transistor which, in turn, reduces VCC bounce.

Furthermore, the strong p-channel transistor P21 of inverter 420 produces a fast rise time (a fast charge time). The quick rise time quickly turns off the corresponding p-channel driver transistor which, in turn, increases the maximum operating frequency.

Thus, the output rise times of the delayed gate signals DDA output from stages SAS will be much faster than the output fall times. Since delay stages SAS1–SASn directly drive transistors P1–Pn in FIG. 11, each p-channel driver transistor P1–Pn will turn off very fast, and will turn on relatively slowly.

For medium speed applications where moderate VCC bounce is acceptable, inverter 1210 of stage SAS1 and inverters 420 of delay stages SAS2–SASn can be identically formed. However, for higher-speed, low VCC bounce applications, it is usually best to individually adjust the sizes of the n-channel transistors of inverter 1210 (420) and inverters 420.

This adjustment is required if delay line 1110 is to operate at even higher operating frequencies because the strength of the n-channel transistor used in inverter 1210 of delay stage SAS1 can significantly affect the fall time at the output of inverter 420 of delay stage SAS2. Similarly, the strength of the n-channel transistor used in inverter 420 of delay stage SAS2 can significantly affect the fall time at the output of the inverter 420 of delay stage SASn.

Thus, individually adjusting the sizes of the n-channel transistors in inverter 1210 (420) of stage SAS1 and inverters 420 of stages SAS2–SASn allows the optimum combination of stage-to-stage turn-on delay and fall time. This optimum combination minimizes VCC bounce at the desired operating frequency.

If the stage-to-stage delay of delay line 1110 is insufficient, some of the p-channel driver transistors P1–Pn can be turned on at the same time at the cost of increased VCC bounce. Similarly, if the fall time of inverter 1210 of stage SAS1 and inverters 420 of stages SAS2–SASn are too short, VCC bounce is also increased.

Figure 13:
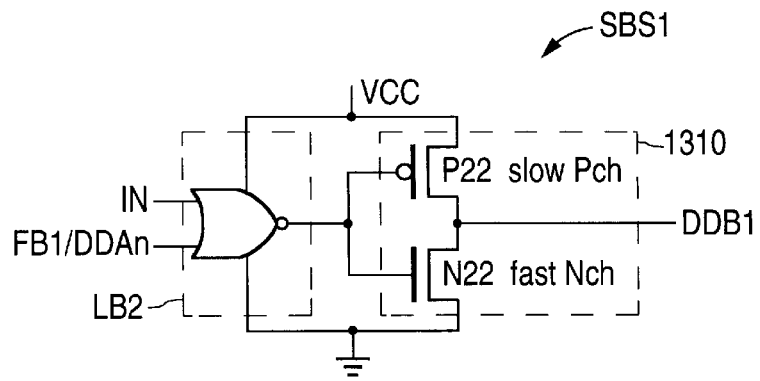
FIG. 13 is a circuit diagram illustrating an example of initial delay stage SBS1 in accordance with the present invention.

FIG. 13 shows a circuit diagram that illustrates an example of initial delay stage SBS1 in accordance with the present invention. As shown in FIG. 13, delay stage SBS1 includes a logic block LB2 that has a first input that is connectable to receive the input signal IN, a second input that is connected to receive the feedback signal FB1, and an output. In the preferred embodiment of the present invention, logic block LB2 is implemented with a NAND gate (other logic circuits may alternately be used).

As further shown in FIG. 13, delay stage SBS1 also includes an inverter 1310 that has an input connected to the output of logic block LB2, and an output that outputs delayed first signal DDA1. In the present invention, inverter 1310 is formed to be the same as inverter 520. Logic block LB2 (the NAND gate) in combination with inverter 1310 makes initial delay stage SBS1 non-inverting.

Delay stages SBS2–SBSn are formed to be the same as delay stage SBS shown in FIG. 5. As noted above, delay stage BS has a first inverter 510 and a second inverter 520. The NAND gate of delay stage SBS1 and the first inverters 510 of delay stages SBS2–SBSn can be implemented as ordinary CMOS gates with no special strong or weak transistor sizing requirements.

Inverter 1310 (520) of stage SBS1 and inverters 520 of stages SBS2–SBSn, on the other hand, are implemented using a relatively weak (small) p-channel transistor P22 and a relatively strong (large) n-channel transistor N22.

The strong n-channel transistor N22 of inverter 520 produces a relatively fast fall time (a fast discharge time). The fast fall time quickly turns off the corresponding n-channel driver transistor which, in turn, increases the maximum operating frequency.

Furthermore, the weak p-channel transistor P22 of inverter 520 produces a slow rise time (a slow charge time). The slow rise time slowly turns on the corresponding n-channel driver transistor which, in turn, reduces ground bounce.

Thus, the output fall times of the delayed gate signals DDB output from stages SBS will be much faster than the output rise times. Since delay stages SBS1–SBSn directly drive transistors N1–Nn in FIG. 11, each n-channel driver transistor N1–Nn will turn off very fast, and will turn on relatively slowly.

For medium speed applications where moderate ground bounce is acceptable, inverter 1310 of stage SBS1 and inverters 520 of delay stages SBS2–SBSn can be identically formed. However, for higher-speed, low VCC bounce applications, it is usually best to individually adjust the sizes of the p-channel transistors of inverter 1310 (520) and inverters 520.

This adjustment is required if delay line 1114 is to operate at even higher operating frequencies because the strength of the p-channel transistor used in inverter 1310 of delay stage SBS1 can significantly affect the rise time at the output of inverter 520 of delay stage SBS2. Similarly, the strength of the p-channel transistor used in inverter 520 of delay stage SBS2 can significantly affect the rise time at the output of the inverter 520 of delay stage SBSn.

Thus, individually adjusting the sizes of the p-channel transistors in inverter 1310 (520) of stage SBS1 and inverters 520 of stages SBS2–SBSn allows the optimum combination of stage-to-stage turn-on delay and rise time. This optimum combination minimizes ground bounce at the desired operating frequency.

If the stage-to-stage delay of delay line 1114 is insufficient, some of the n-channel driver transistors N1–Nn can be turned on at the same time at the cost of increased VCC bounce. Similarly, if the rise time of inverter 1310 of stage SBS1 and inverters 520 of stages SBS2–SBSn are too short, ground bounce is also increased.

FIGS. 14A–14C show waveform diagrams which illustrate a high speed application of circuit 1100 in accordance with the present invention. FIG. 14A shows the input signal IN, FIG. 14B shows the signals DDA1–DDAn output from delay stages SAS1–SASn, and FIG. 14C shows the signals DDB1–DDBn output from delay stages SBS1–SBSn.

As shown in FIGS. 14A–14C, at time t0, the input signal IN is high, the signals DDA1–DDAn output from stages SAS1–SASn are high, and the signals DDB1–DDBn output from stages SBS1–SBSn are high. As a result, p-channel transistors P1–Pn are turned off and n-channel transistors N1–Nn are turned on.

At time t1, the logic state of the input signal IN falls. The change in logic state does not effect the output of the NOR gate, but causes the logic state of the output of the NAND gate to change from a logic low to a logic high. Inverter 1310 then causes the delayed gate signal DDB1 output from delay stage SBS1 to quickly change to a logic low which, in turn, quickly turns off transistor N1. Delay stages SBS2–SBSn then cause transistors N2–Nn to sequentially turn off quickly.

At time t2, the output from the last delay stage SBSn has fallen to a logic low. When the NOR gate detects a logic low on both inputs (from the input signal IN and the last signal DDBn), the NOR gate outputs a logic high. Inverter 1210 then causes the delayed gate signal DDA1 output from delay stage SAS1 to slowly change to a logic low which, in turn, slowly turns on transistor P1. Delay stages SAS2–SASn then cause transistors P2–Pn to sequentially turn on slowly.

At time t3, the input signal IN is low, the signals DDA1–DDAn output from stages SAS1–SASn are low, and the signals DDB1–DDBn output from stages SBS1–SBSn are low. As a result, p-channel transistors P1–Pn are turned on and n-channel transistors N1–Nn are turned off.

At time t4, the logic state of the input signal IN rises. The change in logic state does not effect the output of the NAND gate, but causes the logic state of the output of the NOR gate to change from a logic high to a logic low. Inverter 1210 then causes the delayed gate signal DDA1 output from delay stage SAS1 to quickly change to a logic high which, in turn, quickly turns off transistor P1. Delay stages SAS2–SASn then cause transistors P2–Pn to sequentially turn off quickly.

At time t5, the output from the last delay stage SASn has risen to a logic high. When the NAND gate detects a logic high on both inputs (from the input signal IN and the last signal DDAn), the NAND gate outputs a logic low. Inverter 1310 then causes the delayed gate signal DDB1 output from delay stage SBS1 to slowly change to a logic high which, in turn, slowly turns on transistor N1. Delay stages SBS2–SBSn then cause transistors N2–Nn to sequentially turn on slowly.

Thus, all of the delayed gate signals DDB1–DDBn fall before any of the delayed gate signals DDA1–DDAn fall. This insures that all of the n-channel transistors will be turned off before any of the p-channel transistors are turned on. Similarly, all of the delayed gate signals DDA1–DDAn rise before any of the delayed gate signals DDB1–DDBn rise. This insures that all of the p-channel transistors will be turned off before any of the n-channel transistors are turned on.

The fast rise times of the p-channel driver transistors P1–Pn and the fast fall times of the n-channel driver transistors N1–Nn do not affect ground bounce. These fast rise and fall times, however, increase the maximum operating frequency (an important attribute of a high-performance output driver).

As shown in FIGS. 11, 12, and 13, logic blocks LB1 and LB2, and the NOR and NAND gates, provide an interlocking capability between the delay line 1110 and the delay line 1114. Delay line interlocking insures that all of the p-channel driver transistors P1–Pn are turned off before any of the n-channel driver transistors N1–Nn are turned on. Similarly, delay line interlocking also insures that all of the n-channel driver transistors N1–Nn are turned off before any of the p-channel driver transistors P1–Pn are turned on.

It should be understood that various alternatives to the embodiment of the invention described herein may be employed in practicing the invention. For example, the input of delay line 1110 and the input of delay line 1114 can be separated when a switchable high impedance buffer, such as a TRI-STATE™ buffer, is being utilized.

FIG. 15 shows a circuit diagram illustrating a low ground bounce/low power supply bounce output driver 1500 in accordance with the present invention. Driver 1500 is similar to driver 1100 and, as a result, utilizes the same reference numerals to designate the structures which are common to both drivers.

As shown in FIG. 15, driver 1500 differs from driver 1100 in that driver 1500 has a first input signal IN1 which is input to delay line 1110, and a second input signal IN2 which is input to delay line 1114.

Thus, it is intended that the following claims define the scope of the invention and that methods and structures within the scope of these claims and their equivalents be covered thereby.

What is claimed is:

1. An output driver that drives a voltage on an output node to a value, the driver comprising:

a first delay line having a plurality of first delay stages that output a corresponding plurality of delayed first signals, the delayed first signals having a plurality of logic states, the first delay line having a first input to receive a first control signal, and a second input that is connected to receive a first feedback signal, none of the first delay stages being connected to the output node;

a plurality of first driver transistors which are each connected to a first delay stage to receive a delayed first signal and to the output node;

a second delay line having a plurality of second delay stages that output a corresponding plurality of delayed second signals, the delayed second signals having a plurality of logic states, the second delay line having a third input to receive a second control signal, and a fourth input that is connected to receive a second feedback signal, a delayed first signal of the plurality of delayed first signals setting a logic state of a second feedback signal, a delayed second signal of the plurality of delayed second signals setting a logic state of a first feedback signal, none of the second delay stages being connected to the output node; and a plurality of second driver transistors which are each connected to receive a delayed second signal, the second driver transistors being connected to the first driver transistors and the output node.

2. The driver of claim 1 wherein the delayed first signal that sets the logic state of the second feedback signal is output from a last delay stage of the first delay stages.

3. The driver of claim 1 wherein the delayed second signal that sets the logic state of the first feedback signal is output from a last delay stage of the second delay stages.

4. The driver of claim 1
   wherein the number of first control signals and the number of first feedback signals have a plurality of logic states, and
   wherein the first delay line changes the logic states of the delayed first signals at different times in response to changes in the logic states of the number of first control signals and the number of first feedback signals.

5. The driver of claim 1
   wherein the number of second control signals and the number of second feedback signals have a plurality of logic states, and
   wherein the second delay line changes the logic states of the delayed second signals at different times in response to changes in the logic states of the number of second control signals and the number of second feedback signals.

6. The driver of claim 1 wherein an initial delay stage of the first delay line includes:

a first logic function having the first input, the second input that is connected to receive the first feedback signal, and an output; and a first inverter having an input connected to the output of the first logic function, and an output that outputs a delayed first signal.

7. The driver of claim 6 wherein the first logic function is a NOR gate.

8. The driver of claim 7 wherein the first inverter includes a first inverter transistor having a width to length ratio, and a second inverter transistor having a width to length ratio, the first inverter transistor having a width to length ratio that is greater than the width to length ratio of the second inverter transistor.

9. The driver of claim 6 wherein an initial delay stage of the second delay line includes:

a second logic function having the third input, the fourth input that is connected to receive the second feedback signal, and an output; and a second inverter having an input connected to the output of the second logic function, and an output that outputs a delayed second signal.

10. The driver of claim 9 wherein the second logic function is a NAND gate.

11. The driver of claim 10 wherein the second inverter includes a first inverter transistor having a width to length ratio, and a second inverter transistor having a width to length ratio, the second inverter transistor of the second inverter having a width to length ratio that is less than the width to length ratio of the first inverter transistor of the second inverter.

12. The driver of claim 9 wherein the delayed first signal output by the first inverter has a rise time and a fall time, and wherein the rise time is less than the fall time.

13. The driver of claim 1 wherein a first driver transistor is a p-channel MOS transistor, and a second driver transistor is an n-channel MOS transistor.

14. The driver of claim 11 wherein the delayed second signal output by the second inverter has a rise time and a fall time, and wherein the rise time is less than the fall time.

15. The driver of claim 1 wherein the first driver transistors and the second driver transistors are connected to an output pad.

16. The driver of claim 1 wherein the first input of the initial delay stage of the first delay circuit is connected to the first input of the initial delay stage of the second delay circuit.

17. The driver of claim 1 wherein the first control signals and the second control signals are the same.

18. An output driver comprising:

a plurality of first delay stages that each have an output, the plurality of first delay stages being connected in a first sequence so that, except for a last first delay stage, the output of each first delay stage is connected to an input of a next first delay stage in the first sequence, an initial first delay stage having a first input and a second input;

a plurality of first driver transistors connected to an output node, each first driver transistor having, and being connected to the output of, a corresponding first delay stage;

a plurality of second delay stages that each have an output, the plurality of second delay stages being connected in a second sequence so that, except for a last second delay stage, the output of each second delay stage is connected to an input of a next second delay stage in the second sequence, an initial second delay stage having a third input and a fourth input, the second input of the initial first delay stage being connected to the output of the last second delay stage, the fourth input of the initial second delay stage being connected to the output of the last first delay stage; and a plurality of second driver transistors connected to the output node, each second driver transistor having, and being connected to the output of, a corresponding second delay stage.

19. The driver of claim 18 wherein an initial delay stage of the first sequence includes:

a first logic function having the first input, the second input, and an output; and a first inverter having an input connected to the output of the first logic function, and an output that outputs a delayed first signal.

20. The driver of claim 19 wherein the first logic function is a NOR gate.

21. The driver of claim 19 wherein the first inverter includes a first inverter transistor having a width to length ratio and being connected to a steady first voltage, and a second inverter transistor having a width to length ratio and being connected to a steady second voltage, the second voltage being less than the first voltage, the first inverter transistor having a width to length ratio that is greater than the width to length ratio of the second inverter transistor.

22. The driver of claim 19 wherein an initial delay stage of the second sequence includes:

a second logic function having the third input, the fourth input, and an output; and a second inverter having an input connected to the output of the second logic function, and an output that outputs a delayed second signal.

23. The driver of claim 22 wherein the second logic function is a NAND gate.

24. The driver of claim 23 wherein the second inverter includes a first inverter transistor having a width to length ratio and being connected to a steady first voltage, and a second inverter transistor having a width to length ratio and being connected to a steady second voltage, the second voltage being smaller than the first voltage, the second inverter transistor of the second inverter having a width to length ratio that is greater than the width to length ratio of the first inverter transistor of the second inverter.

25. The driver of claim 19 wherein the delayed first signal output by the first inverter has a rise time and a fall time, and wherein the rise time is less than the fall time.

26. The driver of claim 18 wherein a first driver transistor is a p-channel MOS transistor, and a second driver transistor is an n-channel MOS transistor.

27. The driver of claim 22 wherein the delayed second signal output by the second inverter has a rise time and a fall time, and wherein the rise time is greater than the fall time.

28. The driver of claim 18 wherein the first input of the initial delay stage of the first delay circuit is connected to the third input of the initial delay stage of the second delay circuit.

* * * * *